United States Patent [19]
Blake et al.

[11] Patent Number: 5,995,010
[45] Date of Patent: Nov. 30, 1999

[54] OUTPUT BUFFER PROVIDING TESTABILITY

[75] Inventors: Terence G. W. Blake; Bernhard H. Andresen, both of Dallas; Frederick G. Wall, Garland, all of Tex.

[73] Assignee: Texas Instruments Incorporated, Dallas, Tex.

[21] Appl. No.: 09/001,049

[22] Filed: Dec. 3, 1997

Related U.S. Application Data

[60] Provisional application No. 60/035,925, Jan. 2, 1997.

[51] Int. Cl.[6] .............................................. H03K 19/0185
[52] U.S. Cl. .......................... 340/653; 324/73.1; 326/63; 326/80
[58] Field of Search ........................... 340/653; 324/73.1, 324/500, 522, 158.1; 326/62, 63, 80, 81, 101, 31, 136

[56] References Cited

U.S. PATENT DOCUMENTS

| | | | |
|---|---|---|---|
| 4,656,417 | 4/1987 | Kirkpatrick et al. | 326/16 |
| 4,967,151 | 10/1990 | Barish et al. | 324/765 |
| 5,646,550 | 7/1997 | Campbell, Jr. et al. | 326/81 |
| 5,764,077 | 6/1998 | Andresen et al. | 326/34 |
| 5,818,257 | 10/1998 | Villa | 326/81 |

*Primary Examiner*—Edward Lefkowitz
*Attorney, Agent, or Firm*—Christopher L. Maginniss; W. James Brady III; Richard L. Donaldson

[57] ABSTRACT

According to one embodiment of the present invention, an output buffer (200) includes a first output driver (86) and a second output driver (88). A first output cascode (80) coupled to the first output driver (86) protects the gate oxide of the first output driver (86) from voltage changes on the output (16). A second output cascode (84) coupled to the second output driver (88) protects the gate oxide of the second output driver (88) from voltage changes on the output (16). A level shifter (60) includes multiple cascode devices (66, 68, 70, 72) and switches the first output driver according to the values of a data input (12) and an enable input (14). A first testability device (202, 204, 206, 208) coupled to a cascode device (66, 68, 70, 72) of the level shifter (60) generates a current in response to failure of the cascode device (66, 68, 70, 72).

20 Claims, 3 Drawing Sheets

1

OUTPUT BUFFER PROVIDING TESTABILITY

This application claims priority under 35 U.S.C. § 119 (e)(1) of provisional application Ser. No. 60/035,925 filed Jan. 2, 1997, entitled "Output Buffer Providing Testability," the entirety of which is incorporated herein by reference.

TECHNICAL FIELD OF THE INVENTION

This invention relates in general to the field of electronic circuits, and more particularly to an output buffer providing testability.

BACKGROUND OF THE INVENTION

Many output buffer circuits are coupled to one or more power supplies and use one or more output drivers to switch an output voltage according to the values of one or more inputs. For example, an output buffer that receives a high voltage (VDDHV) from a first power supply and a chip core voltage (VDD) from a second power supply might have p-channel and n-channel output drivers to switch an output voltage according to the values of a data input and an enable input. It is often desirable to protect the gate oxides of these output drivers and other components of the output buffer from overstress, break down, or other damage due to voltage levels on the output. Typically, the gate oxide of a transistor can withstand DC voltages only up to approximately VDD plus a transistor threshold voltage, a fact which motivates much of the circuitry of the present invention.

As microelectronic devices become increasingly complex to satisfy additional processing requirements, reducing the failure of devices during operation becomes increasingly important. A known technique for protecting the gate oxide of an n-channel output driver includes coupling a cascode device between the output driver and the output to shield the gate oxide of the output driver from voltage levels on the output. The gate of the cascode is maintained at a substantially constant intermediate voltage, such that the voltage across the gate oxide does not exceed the gate oxide's maximum fixed voltage tolerance. Although these techniques protect the output driver gate oxide when the cascode is functioning properly, the output driver is susceptible to failure if the cascode device has shorted, even though the output buffer may appear to be functioning properly. Furthermore, such techniques do not provide for detection of cascode failure, leaving previous output buffers and the associated electronic devices prone to unexpected failure during operation. These and other inadequacies make prior output buffers unsuitable for many applications.

SUMMARY OF THE INVENTION

According to the present invention, disadvantages and problems associated with previous output buffers have been substantially reduced or eliminated.

According to one embodiment of the present invention, an output buffer coupling a data input and an enable input to an output receives a first voltage from a first power supply and a second voltage from a second power supply. The output buffer includes a first output driver having a gate and a gate oxide. A first output cascode coupled to the first output driver and to the output has a gate maintained at a first substantially constant voltage and protects the gate oxide of the first output driver from voltage changes on the output. The output buffer also includes a second output driver having a gate and a gate oxide. A second output cascode coupled to the second output driver and to the output has a gate maintained at a second substantially constant voltage and protects the gate oxide of the second output driver from voltage levels on the output. A level shifter coupled to the data input, to the enable input, and to the first output driver includes multiple cascode devices and provides a voltage to switch the first output driver according to the values of the data input and the enable input. A first testability device coupled to a first cascode device of the level shifter generates a first current in response to failure of the first cascode device.

The output buffer and method of the present invention provide a number of important technical advantages. The output buffer includes one or more testability devices that each correspond to a cascode device of the level shifter, to a p-channel output cascode (PCOC) coupled to a p-channel output driver (PCOD), or to an n-channel output cascode (NCOC) coupled to an n-channel output driver (NCOD). Each testability device generates current in response to failure of the corresponding cascode device to indicate failure of the cascode device. The current is detectable as increased or decreased current on an associated power supply. Since the PCOC, the NCOC, and the cascode devices of the level shifter protect the gate oxides of the PCOD, the NCOD, and corresponding devices of the level shifter, respectively, and since the failure of any one of these cascodes will leave the output buffer and associated electronic device susceptible to failure during operation, providing for testability of the condition of the output buffer is an important technical advantage.

Another important technical advantage of the present invention is that a testability device coupled to the level shifter turns the PCOD off when the second power supply is not supplying the second voltage (VDD) to the output buffer to place the output buffer in a high-impedance state. Yet another important technical advantage includes providing VDD directly to the gates of the PCOC, the NCOC, and the cascode devices of the level shifter to eliminate the space, current, and complexity associated with reference bias generators, without unduly sacrificing performance. The present invention provides testability and numerous other important technical advantages while protecting the gate oxides of the output buffer from overstress, break down, or other damage.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
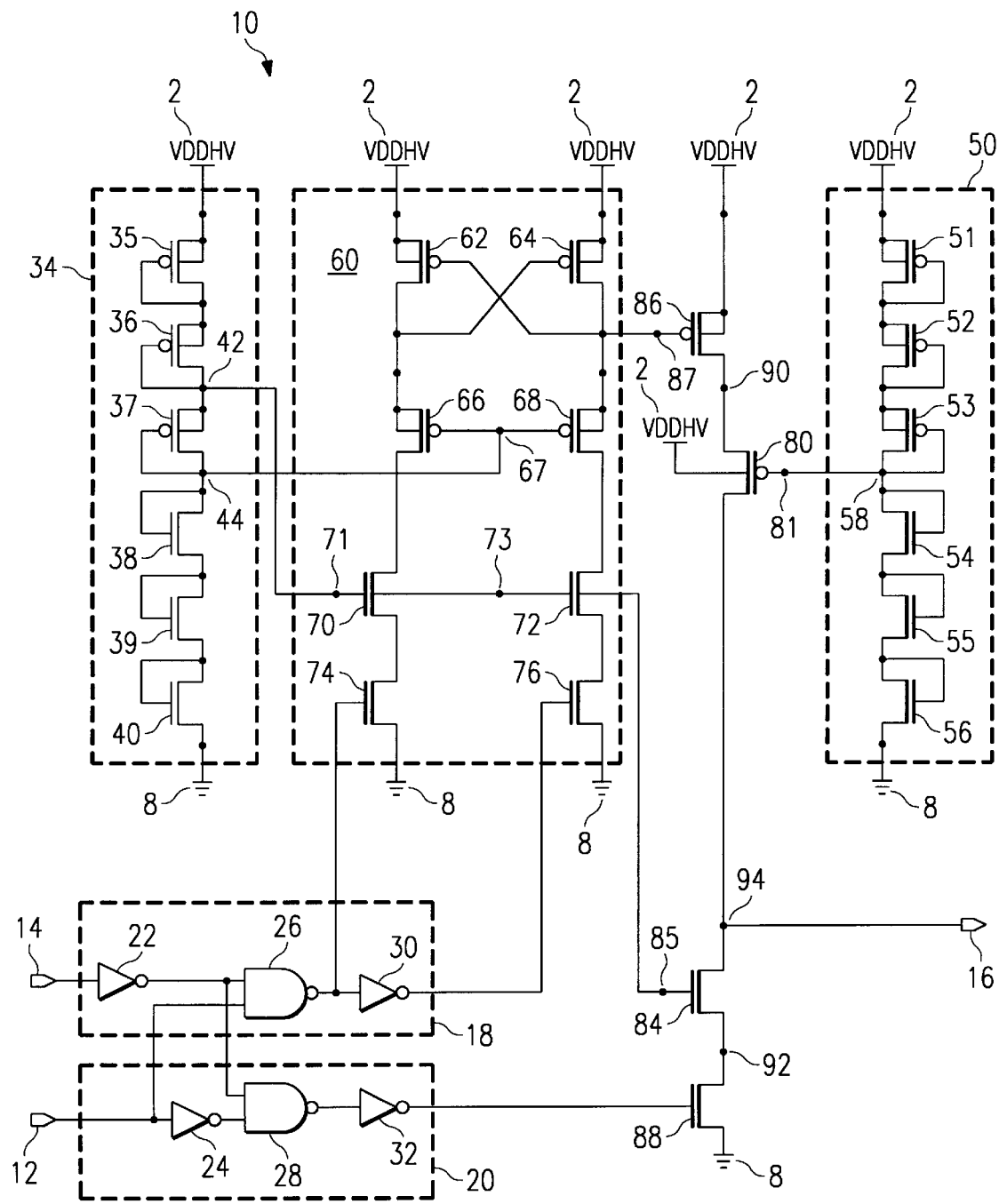
FIG. 1 illustrates an output buffer according to the present invention.

FIG. 1 illustrates an exemplary output buffer 10 for complementary metal-oxide semiconductor (CMOS) applications coupled to a high voltage power supply 2 that provides a voltage (VDDHV) of approximately 3.0 V to approximately 3.6 V to output buffer 10. Output buffer 10 is coupled to a data input 12, an enable input 14, and an output 16. Data input 12, enable input 14, or both data input 12 and enable input 14 may have a low or "0" value corresponding to ground or any other suitable reference voltage or a high or "1" value that corresponds to the chip core voltage (VDD) of the electronic device that contains output buffer 10, which may be approximately 1.65 V to approximately 1.95 V for typical applications. In one embodiment, VDDHV is approximately 3.3 V and VDD is approximately 1.8 V, which is approximately one-half of VDDHV. The present invention contemplates any suitable combination of VDDHV and VDD. In general, output buffer 10 converts a low voltage signal on data input 12 to a higher voltage signal on output 16. The devices that form output buffer 10 may have any dimensions suitable to provide output buffer 10 with adequate drive strength, adequate speed in switching output 16 between low and high according to values of data input 12 and enable input 14, and acceptably low leakage current when output 16 is in a high-impedance or non-asserted state.

Output buffer 10 includes a level shifter 60 designed to provide VDDHV to the gate (at node 87) of a p-channel output driver (PCOD) 86 to switch PCOD 86 according to the values of data input 12 and enable input 14. Level shifter 60 includes p-channel pull-ups 62 and 64, p-channel cascodes 66 and 68, n-channel cascodes 70 and 72, and switching n-channels 74 and 76. P-channel pull-ups 62 and 64 are coupled to power supply 2, and switching n-channels 74 and 76 are coupled to a ground or any other suitable reference voltage 8, as shown in FIG. 1. Level shifter 60 may include p-channel metal-oxide-semiconductor (PMOS) and n-channel metal-oxide-semiconductor (NMOS) devices in any suitable combination. In operation of output buffer 10, if data input 12 is low and enable input 14 is low, gate 87 of PCOD 86 is driven to approximately VDDHV and PCOD 86 is turned off. In the alternative, if data input 12 is high, gate 87 of PCOD 86 is driven to approximately one-half of VDDHV and PCOD 86 is on. The present invention contemplates shifting the gate voltage of PCOD 86 according to the values of data input 12 and enable input 14 in any suitable manner.

Output buffer 10 includes p-channel pre-driver logic (PPDL) 18 having inverter 22, NAND gate 26, and inverter 30. PPDL 18 couples data input 12 and enable input 14 to switching n-channels 74 and 76 of level shifter 60 as shown. Output buffer 10 also includes n-channel pre-driver logic (NPDL) 20 having inverter 24, NAND gate 28, and inverter 32. NPDL 20 couples data input 12 and inverter 22 of PPDL 18 to an n-channel output driver (NCOD) 88 as shown in FIG. 1. Other appropriate elements may replace or combine with inverters 22 and 24, NAND gates 26 and 28, and inverters 30 and 32 according to particular needs.

Output buffer 10 includes a pre-driver bias generator (PDBG) 34 and an output bias generator (OPBG) 50, although a single bias generator may perform the functions of PDBG 34 and OPBG 50 discussed below. PDBG 34 includes a stack of diode-connected transistors 35, 36, 37, 38, 39, and 40, in series from power supply 2 to ground 8. When VDDHV equals 3.3 V, the voltage drop across each transistor of PDBG 34 is approximately 0.55 V [(3.3 V)/6], the voltage at node 42 is approximately 2.2 V, which is approximately two-thirds of VDDHV, and the voltage at node 44 is approximately 1.65 V, which is approximately one-half of VDDHV. Output bias generator (OPBG) 50 includes a stack of transistors 51, 52, 53, 54, 55, and 56, in series from power supply 2 to ground 8. When VDDHV equals 3.3 V, the voltage drop across each transistor of OPBG 34 is approximately 0.55 V [(3.3 V)/6], as for PDBG 34, and the voltage at node 58 is approximately 1.65 V or approximately one-half of VDDHV. Transistors 35, 36, and 37 of PDBG 34 and transistors 51, 52, and 53 of OPBG 50 may be PMOS devices, and transistors 38, 39, and 40 of PDBG 34 and transistors 54, 55, and 56 of OPBG 50 may be NMOS devices, although PDBG 34 and OPBG 50 may include any suitable combination of PMOS and NMOS devices. Providing PDBG 34 and OPBG 50 separate from level shifter 60 provides increased stability against voltage swings on output 16.

Node 42 of PDBG 34 is coupled to gate 71 of n-channel cascode 70, gate 73 of n-channel cascode 72, and gate 85 of an n-channel output cascode (NCOC) 84 to maintain their gate voltages at approximately 2.2 V or two-thirds of VDDHV. Node 44 of PDBG 34 is coupled to gates 67 of p-channel cascodes 66 and 68 to maintain their gate voltages at approximately 1.65 V or one-half of VDDHV. Node 58 of OPBG 50 is coupled to gate 81 of a p-channel output cascode (PCOC) 80 to maintain the gate voltage of PCOC 80 at approximately 1.65 V or one-half of VDDHV. The present invention contemplates supplying any suitable voltages from PDBG 34, OPBG 50, or both PDBG 34 and OPBG 50 to the gates of some or all of these cascode devices, depending upon the relative values of VDD and VDDHV and the electrical characteristics and capabilities of the devices. For example, in the particular embodiment in which VDD is approximately one-half of VDDHV, PDBG 34 may supply approximately one-half of VDDHV to gate 81 of PCOC 80 in addition to supplying approximately one-half of VDDHV to gates 67 of p-channel cascodes 66 and 68, allowing OPBG 50 to be eliminated.

NCOC 84 has a threshold voltage (VT) and will not pull its source 92 above one VT below the voltage at its gate 85, which as discussed above is maintained at approximately two-thirds of VDDHV by PDBG 34. As a result, if output 16 is high at VDDHV and NCOD 88 is on according to the values of data input 12 and enable input 14, the voltage at node 92 goes low to ground, NCOC 84 is turned on, and the voltage across the gate oxide of NCOD 88, from output 16 to node 85 or from node 85 to node 92, is not sufficient to overstress, break down, or damage this gate oxide. If output 16 is high at VDDHV and NCOD 88 is off according to the values of data input 12 and enable input 14, the voltage at node 92 is pulled up to the voltage at node 85 minus VT, whereupon NCOC 84 is turned off, and the voltages across the gate oxide of NCOD 88 are again less than the maximum that the gate oxide can tolerate. The above discussion applies equally to an arrangement in which the gate of NCOC 84 is maintained at approximately VDD or one-half of VDDHV rather than approximately two-thirds of VDDHV.

PCOC 80 operates in a similar manner to protect the gate oxide of PCOD 86 if output 16 goes to ground. PCOC 80 has a threshold voltage (VT) and will not pull its source to below one VT above its gate voltage, which as discussed above is maintained at approximately one-half of VDDHV by OPBG 50. The body of PCOC 80 is additionally coupled to and receives VDDHV from power supply 2. If output 16 goes to ground, the voltage at node 90 is not allowed to go lower than one-half VDDHV plus VT due to PCOC 80, and the voltage from node 90 to node 87, which is at VDDHV due to level shifter 60, across the gate oxide of PCOD 86 is less than the maximum the gate oxide can tolerate without overstressing, breaking down, or otherwise being damaged. As discussed above, the gate voltage of PCOC 80 may be maintained using any bias generator or combination of bias generators that is suitable for the characteristics and capabilities of PCOC 80. Protecting the gate oxides of PCOD 86 and NCOD 88 using PCOC 80 and NCOC 84, respectively, provides an important technical advantage.

In operation of output buffer 10, if data input 12 is high and enable input 14 is low, NCOD 88 is off, switching n-channel 74 is off, switching n-channel 76 is on, p-channel pull-up 62 is on, p-channel pull-up 64 is off, PCOD 86 is on, and output 16 is driven high to approximately VDDHV in an asserted state. As a result, the value of data input 12 is effectively transmitted through output buffer 10 to output 16. Alternatively, if data input 12 is low and enable input 14 is low, NCOD 88 is on, switching n-channel 74 is on, switching n-channel 76 is off, p-channel pull-up 62 is off, p-channel pull-up 64 is on, PCOD 86 is off, and output 16 is low or at ground in an asserted state. Finally, if enable input 14 is high, whether data input 12 is high or low, NCOD 88 is off, switching n-channel 74 is on, switching n-channel 76 is off, p-channel pull-up 62 is off, p-channel pull-up 64 is on, PCOD 86 is off, and output 16 is in a high-impedance non-asserted state with a variable value.

If enable input 14 is high, the voltages at nodes 90 and 92 will depend on the value of output 16, which may vary according to the operation of the electronic device associated with output buffer 10. For the arrangement shown in FIG. 1, the voltage at node 90 may range from approximately 3.3 V (VDDHV) to approximately 1.65 V (one-half of VDDHV) plus the VT associated with PCOD 86. The voltage at node 92 may range from zero (ground) to approximately 2.2 V (two-thirds of VDDHV) minus the VT associated with NCOD 88. The present invention contemplates other suitable voltages at nodes 90 and 92 according to the values of data input 12, enable input 14, and output 16 during operation of output buffer 10. This protection mechanism performed by PCOC 80 and NCOC 84 additionally applies to p-channel cascodes 66 and 68 and n-channel cascodes 70 and 72 of level shifter 60.

If the difference between VDDHV and VDD, which is approximately VDD when VDD is approximately one-half of VDDHV, is near the maximum gate oxide stress, then VDD is approximately the lowest fixed voltage a p-channel cascode can tolerate. Similarly, if VDD is near the maximum gate oxide stress, then VDD is approximately the highest fixed voltage that an n-channel cascode can tolerate. Putting VDD directly on the gates of PCOC 80, NCOC 84, p-channel cascodes 66 and 68, and n-channel cascodes 70 and 72 from the chip power supply allows for the elimination of PDBG 34 and OPBG 50, and the DC current drawn by PDBG 34 and OPBG 50, to simplify output buffer 10. Putting VDD directly on the gates of these cascode devices also stabilizes their conductances, because VDD is more stable against transient voltage changes than the voltages generated using stacks of low-current devices such as in PDBG 34 and OPBG 50. As a result, if VDD is approximately one-half of VDDHV, whether VDDHV is approximately 3.3 V and VDD is approximately 1.65 V, VDDHV is approximately 5.0 V and VDD is approximately 2.5 V, or VDDHV and VDD have any other suitable values, VDD can be used as a reference voltage on cascode devices of output buffer 10 to provide these advantages without sacrificing circuit performance significantly.

Figure 2:
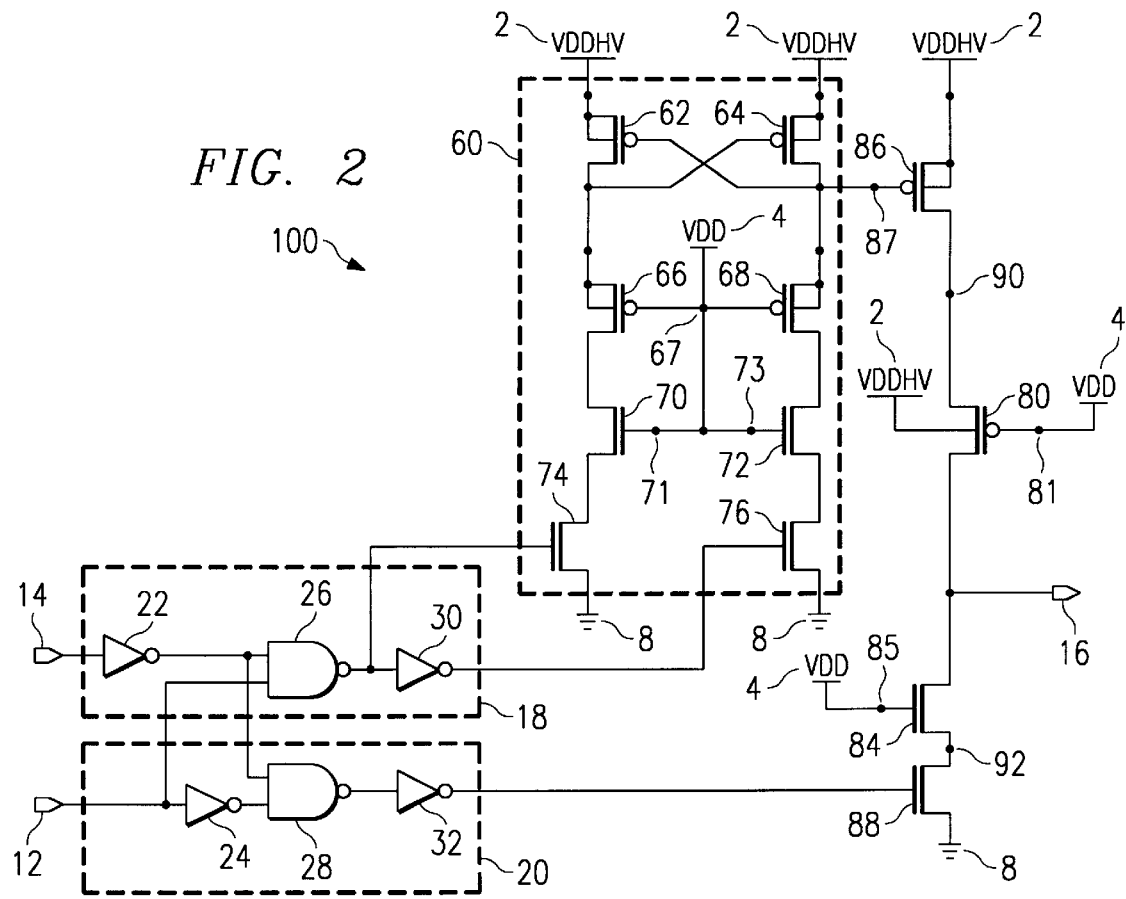
FIG. 2 illustrates an alternative output buffer in accordance with the present invention.

FIG. 2 illustrates an alternative output buffer 100 that operates similarly to output buffer 10 in FIG. 1, except that chip power supply 4 replaces PDBG 34 and OPBG 50 to provide VDD to p-channel cascodes 66 and 68 and n-channel cascodes 70 and 72 of level shifter 60, to PCOC 80, and to NCOC 84. As illustrated in FIG. 2, gates 67 of p-channel cascodes 66 and 68, gates 71 and 73 of n-channel cascodes 70 and 72, respectively, gate 81 of PCOC 80, and gate 85 of NCOC 84 are all coupled to power supply 4 to receive VDD. In one embodiment, as discussed above with reference to FIG. 1, VDDHV is equal to approximately 3.3 V and VDD is equal to approximately 1.8 V or approximately one-half of VDDHV. As a result of this arrangement, also as discussed above with reference to FIG. 1, the voltages across the gate oxide of PCOD 86 and the gate oxide of NCOD 88 are approximately VDD or 1.8 V and these gate oxides are not overstressed, broken down, or otherwise damaged due to voltage swings on output 16 according to the values of data input 12 and enable input 14. Protecting these gate oxides while eliminating the disadvantages associated with PDBG 34 and OPBG 50 provides an important technical advantage of the present invention.

Figure 3:
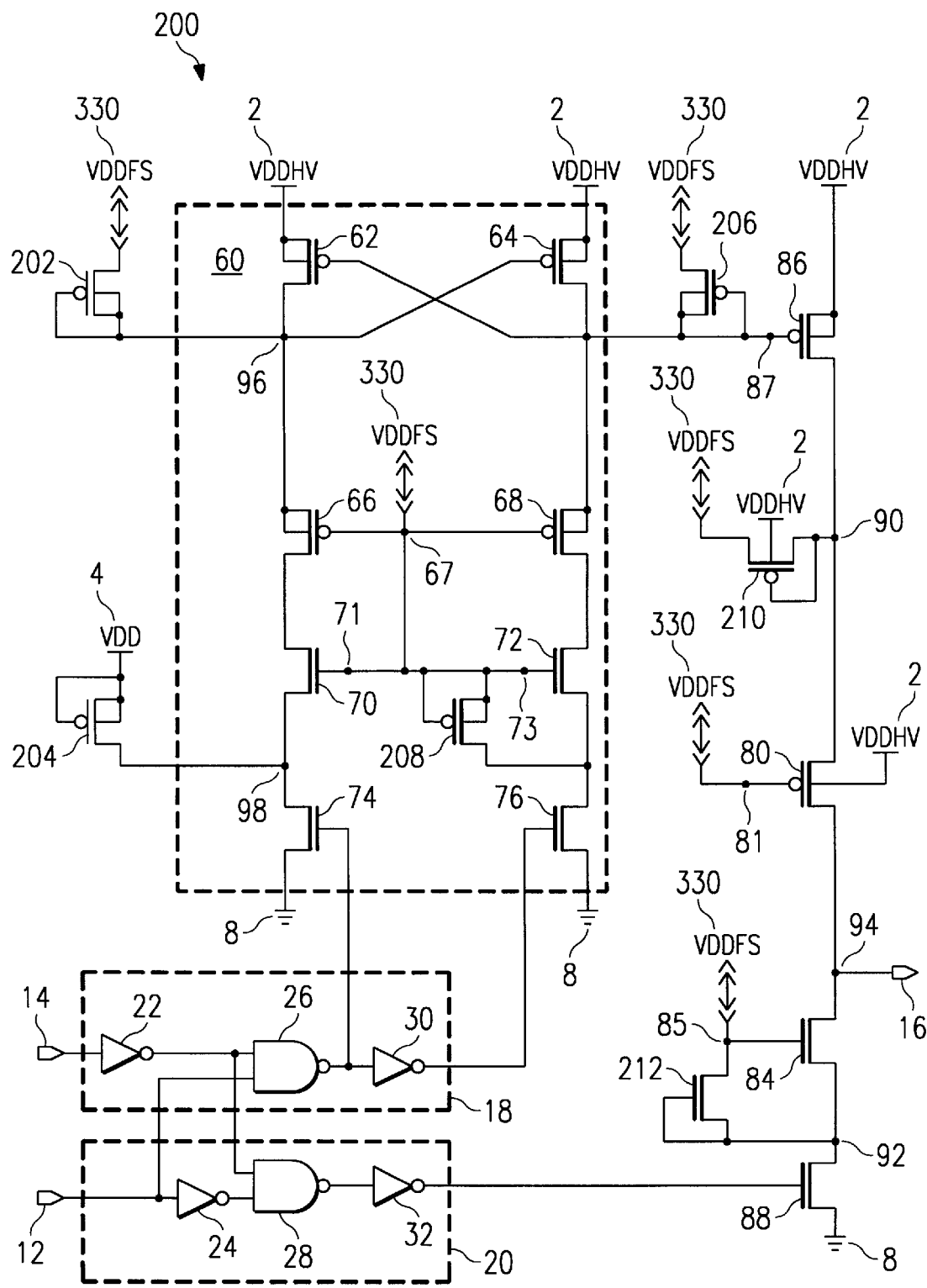
FIG. 3 illustrates an exemplary output buffer having testability and quasi-failsafe operation according to the present invention.

FIG. 3 illustrates an exemplary output buffer 200 having quasi-failsafe operation according to the teachings of the present invention. As discussed more fully below with reference to FIG. 4, output buffer 200 is coupled to an output 330 of a switching bias-generation circuit. The bias-generation circuit generates a quasi-failsafe chip core voltage (VDDFS) to wholly or partially replace VDD to drive output buffer 200. Output buffer 200 remains coupled to power supplies 2 and 4, which respectively provide VDDHV of approximately 3.3 V and VDD of approximately 1.8 V to output buffer 200, as discussed above with reference to FIGS. 1 and 2.

Figure 4:
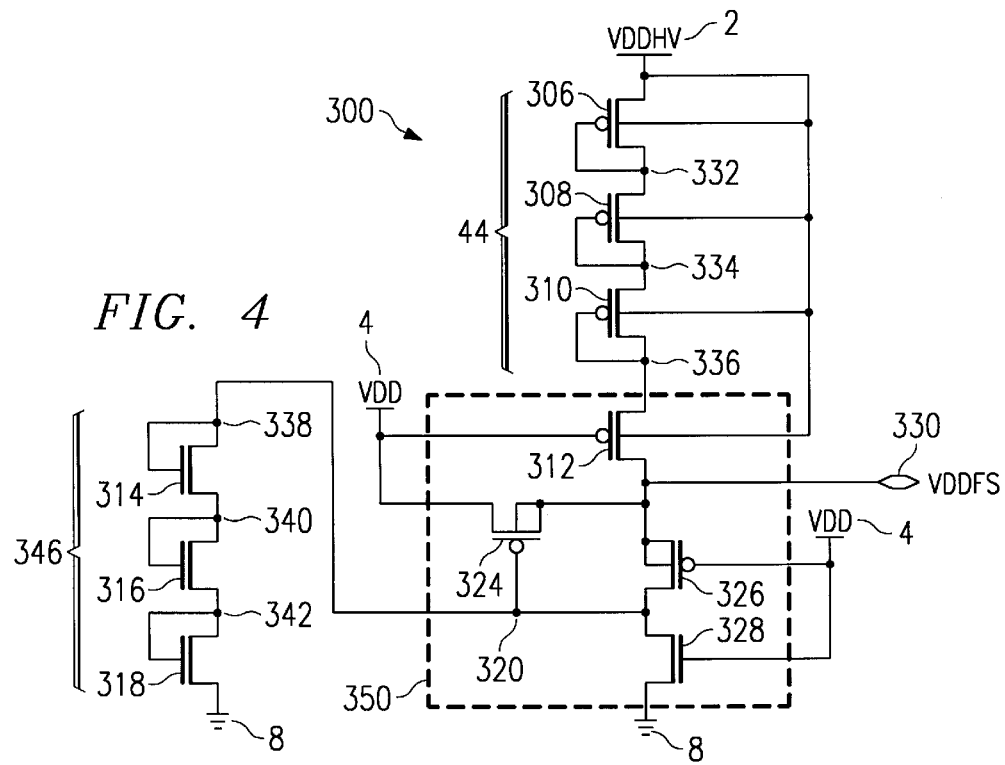
FIG. 4 illustrates an exemplary switching bias-generation circuit according to the present invention.

According to operation of the bias-generation circuit of FIG. 4 discussed thoroughly below, VDDFS is tied strongly to and approximately equals VDD when power supply 4 is supplying power to the bias-generation circuit and output buffer 200. In the alternative, when power supply 4 is not supplying power to the bias-generation circuit and output buffer 200 due to failure of power supply 4 or for any other reason, VDDFS equals approximately one-half of VDDHV. In either case, the gate oxides of PCOD 86 and NCOD 88 are protected from overstress, break-down, or any other damage in the manner discussed above with reference to FIGS. 1 and 2. This quasi-failsafe operation of output buffer 200 as a result of VDDFS from the bias-generation circuit of FIG. 4 is yet another important technical advantage of the present invention, because unlike prior systems, output buffer 200 is protected from failure when VDD from power supply 4 is interrupted for any reason.

Output buffer 200 also includes testability devices 202, 204, 206, 208, 210, and 212, singly or in any suitable combination, that allow for monitoring of p-channel cascode 66, n-channel cascode 70, p-channel cascode 68, n-channel cascode 72, PCOC 80, and NCOC 84, respectively, to detect one or more failure modes. Testability devices 202, 206, 208, 210, and 212 are coupled to and receive VDDFS from the bias-generation circuit of FIG. 4. Testability device 210 is also coupled to and receives VDDHV from power supply 2 at its body. Testability device 204 is coupled to and receives VDD from power supply 4 rather than receiving VDDFS from the bias-generation circuit of FIG. 4, the advantage of which is discussed more fully below. In one embodiment, each testability device 202, 204, 206, 208, and 210 is a diode p-channel field effect transistor (diode-PFET) and testability device 212 is a diode n-channel field effect transistor (diode-NFET), although output buffer 200 may have any suitable combination of diode-PFET and diode-NFET devices. The operation of testability devices 202, 204, 206, 208, 210, and 212 is discussed using testability device 210 as an example, although it should be understood that this discussion applies equally to other testability devices of output buffer 200.

In one embodiment, output buffer 200 could appear to function, in whole or in part, even if PCOC 80 is shorted between node 94 and node 90 or is damaged or susceptible to failure to turn off, due to a processing defect or for any other reason. Such a failure of PCOC 80 will prevent PCOC 80 from properly protecting the gate oxide of PCOD 86 in the manner discussed above with reference to FIGS. 1 and 2. Detecting that PCOC 80 is shorted using testability device 210 allows for detection of potential damage to the gate oxide of PCOD 86, which provides an important technical advantage of the present invention.

Still using testability device 210 as an example, the drain region of testability device 210 receives VDDFS, which typically equals VDD. If PCOC 80 is functioning properly, PCOC 80 will not pull node 90 below VDDFS and testability device 210 will not draw current. If PCOC 80 is shorted between nodes 94 and 90 as in a typical failure mode, node 90 will follow node 94 below VDDFS and the current that testability device 210 draws is detectable as increased current on output 16. Monitoring the current at output 16 allows for the detection of failure of PCOC 80. Testability device 212 operates in a similar manner to draw current detectable on output 16 to indicate failure of NCOC 84 and the potential for damage to the gate oxide of NCOD 88. The present invention contemplates testability devices 210 and 212 cooperating in any suitable manner to indicate failure of PCOC 80 or NCOC 84, respectively. Although the testability devices of output buffer 200 are discussed as drawing current in response to failure of an associated device, the testability devices may generate current in any direction to indicate such failure.

Referring to level shifter 60, if p-channel cascode 66 is shorted or stuck "on" for some reason, the voltage at node 96 can fall to zero. In this case, output buffer 200 may continue to function, in whole or in part, even though the gate oxides of p-channel pull-ups 62 and 64 may be overstressed. Testability device 202 draws or otherwise generates current from power supply 4 through circuit 300 in this situation to indicate failure of p-channel cascode 66. Similarly, if n-channel cascode 70 is shorted, the voltage at node 98 can rise to VDDHV, which may overstress the gate oxide of switching n-channel 74. In this situation, testability device 204 draws current from power supply 2 at VDDHV to power supply 4 at VDD that is detectable as changes in current on power supplies 2 and 4 to indicate failure of n-channel cascode 70. Testability devices 206 and 208 operate in a similar manner to draw current on power supply 4 to indicate failure of p-channel cascode 68 or n-channel cascode 72, respectively.

The present invention contemplates detecting failure of p-channel cascode 66, p-channel cascode 68, n-channel cascode 70, and n-channel cascode 72, singly or in any suitable combination, using testability devices 202, 206, 204, and 208, respectively. In one embodiment, detection of multiple concurrent failures may require measurement of current changes on power supply 2 instead of, or in addition to, measurement of current changes on power supply 4 as discussed above. For example, if p-channel cascode 66 and n-channel cascode 72 both fail, or if p-channel cascode 68 and n-channel cascode 70 both fail, current may flow to power supply 4 as a result of one failure and from power supply 4 as a result of the other failure to substantially balance any increased or decreased current on power supply 4 that would otherwise be detectable. In this situation, measurement of the current on power supply 2 will indicate failure of either of pair of cascode devices, because there will be a current change on power supply 2 even though no current change on power supply 4 is apparent due to this balancing. Increased or decreased current on power supply 2, power supply 4, or both power supply 2 and power supply 4 may be detected to indicate multiple failure modes of cascode devices of output buffer 200.

In one embodiment, testability device 204 coupled to power supply 4 additionally places output buffer 200 in a high-impedance state when power supply 4 is not supplying VDD to output buffer 200, due to failure of power supply 4 or for another reason. If power supply 4 is not supplying VDD, which is approximately 1.8 V or approximately one-half of VDDHV for typical applications, testability device 204 pulls the left side of level shifter 60 low, such that the gate of PCOD 86 is pulled up to VDDHV and PCOD 86 is off. The right side of level shifter 60 is not pulled low when power supply 4 is not supplying VDD to output buffer 200, because the gates of testability devices 206 and 208 on the right side of level shifter 60 are maintained at half of VDDHV due to the bias-generation circuit of FIG. 4. The present invention contemplates output buffer 200 having one or more testability devices and receiving VDD directly from power supply 4 instead of receiving VDDFS from bias-generation circuit 300, having no testability devices and receiving VDD directly from power supply 4 instead of receiving VDDFS from bias-generation circuit 300, or in any other suitable arrangement.

FIG. 4 illustrates an exemplary switching bias-generation circuit 300 for generating a quasi-failsafe chip core voltage (VDDFS) at output 330 to supply output buffer 200. Circuit 300 is coupled to power supply 2 and to power supply 4, which as discussed above supply VDDHV and VDD, respectively, to circuit 300. An upper stack 344 of circuit 300 includes transistors 306, 308, and 310 in series from power supply 2 to transistor 312. Lower stack 346 includes transistors 314, 316, and 318 in series from node 320 to ground 8. In a particular embodiment, transistors 306, 308, and 310 of upper stack 344 are p-channel devices and transistors 314, 316, and 318 of lower stack 346 are n-channel devices, although any suitable combination of p-channel devices and n-channel devices for transistors 306, 308, 310, 314, 316, and 318 may be used without departing from the intended scope of the present invention. Circuit 300 has a switching portion 350 that couples upper stack 344 to lower stack 346 and includes n-channel transistor 328 and p-channel transistors 312, 324, and 326. Switching portion 350 is also coupled to power supply 4, ground 8, and output 330 as shown.

In operation of circuit 300, if both power supply 2 and power supply 4 are coupled to and supplying power to circuit 300, VDDFS and VDDHV will remain at approximately 1.8 V and approximately 3.3 V, respectively. Due to the construction and series arrangement of transistors 306, 308, and 310 in upper stack 344, the voltages at nodes 332, 334, and 336 progressively decrease from VDDHV at the source of transistor 306 to VDD at the drain of transistor 312. In this case, transistors 306, 308, 310, and 312 each have a source-to-gate threshold voltage (VT) approximately equal to 0.375 V [(VDDHV−VDD)/4]. Nodes 332, 334, and 336 are at approximately 2.925 V [VDD+3 VT], 2.55 V [VDD+2 VT], and 2.175 V [VDD+VT], respectively. Transistor 312 is turned off, transistor 324 is turned on, transistor 326 is turned off, transistor 328 is turned on, and lower stack 346 is cut off such that the voltages at nodes 338, 340, and 342 are zero. As a result, VDDFS at output 330 is tied to and approximately equals VDD, which is approximately one-half of VDDHV, and is less than the maximum voltage for the gate oxides discussed above with reference to FIG. 1. Although slight leakage current from VDDHV may occur, the amount of which may depend on the size of the transistors in upper stack 44, the total current from VDDHV to VDD is decreased.

Alternatively, if power supply 2 is coupled to and supplying power to circuit 100, but power supply 4 is disconnected from circuit 300, fails for any reason, or is not powered up, VDD approaches zero while VDDHV remains at approximately 3.3 V. Similar to the above discussion, due to the construction and series arrangement of transistors 306, 308, and 310 in upper stack 344, the voltages at nodes 332, 334, and 336 will progressively decrease from VDDHV. For the case in which VDD is approximately zero while VDDHV remains at approximately 3.3 V, transistors 312 and 326 are on, while transistors 324 and 328 are off. The source-to-gate threshold voltages (VT) for transistors 306, 308, 310, 314, 316, and 318 are approximately 0.55 V [(VDDHV)/6]. Nodes 332, 334, and 336 might be at approximately 2.75 V, 2.2 V, and 1.65 V, respectively. Similarly, as a result of the construction and series arrangement of transistors 314, 316, and 318 in lower stack 346, the voltages at nodes 338, 340, and 342 will progressively decrease to zero at ground 8, namely 1.65 V, 1.1 V, and 0.55 V, respectively.

In this situation, as discussed above, transistor 312 is turned on, transistor 324 is turned off, transistor 326 is turned on, transistor 328 is turned off, and VDDFS at output 330 is approximately 1.65 V, which is approximately one-half of VDDHV and still less than the maximum voltage for the gate oxides of output buffer 200. The ability to provide VDDFS of approximately one-half of VDDHV even when VDD approaches zero, due to disconnection or failure of power supply 4 or otherwise, is an important technical advantage. Furthermore, placing a single VDDFS on the gates of the cascode devices of output buffer 200 eliminates power supply sequencing problems that might otherwise occur. In one embodiment, bias-generation circuit 300 ties VDDFS strongly to VDD during normal operation when output 16 is swinging between high and low. Bias-generation circuit 300 supports VDDFS equal to one-half of VDDHV during failsafe operation, when output 16 of output buffer 200 are tristated.

Although the present invention has been described above in connection with several embodiments, it should be understood that a plethora of changes, substitutions, variations, alterations, transformations, and modifications may be suggested to one skilled in the art, and it is intended that the present invention encompass such changes, variations, substitutions, alterations, transformations, and modifications as fall within the spirit and scope of the appended claims.

What is claimed is:

1. An output buffer coupling a data input and an enable input to an output, the output buffer operable to receive a first voltage from a first power supply and a second voltage from a second power supply, the output buffer comprising:
    a first output driver having a gate oxide;
    a first output cascode coupled to the first output driver and to the output, the first output cascode having a gate maintained at a first substantially constant voltage, the first output cascode operable to protect the gate oxide of the first output driver from voltage changes on the output;
    a second output driver having a gate oxide;
    a second output cascode coupled to the second output driver and to the output, the second output cascode having a gate maintained at a second substantially constant voltage, the second output cascode operable to protect the gate oxide of the second output driver from voltage changes on the output;
    a level shifter coupled to the data input, to the enable input, and to the first output driver, the level shifter comprising a plurality of cascode devices and operable to provide a voltage to switch the first output driver according to the values of the data input and the enable input; and
    a first testability device coupled to a first cascode device of the level shifter, the first testability device operable to generate a first current in response to failure of the first cascode device.

2. The output buffer of claim 1, wherein the first substantially constant voltage and the second substantially constant voltage are both approximately equal to the second voltage when the second power supply is supplying power to the output buffer.

3. The output buffer of claim 1, wherein the first testability device is coupled to the first power supply, the first current being detectable as a change in current on the first power supply.

4. The output buffer of claim 1, wherein the first testability device is coupled to the second power supply, the first current being detectable as a change in current on the second power supply, the first testability device further operable to turn the first output driver off in response to an interruption in the second voltage from the second power supply to place the output buffer in a high-impedance state.

5. The output buffer of claim 1, further comprising a second testability device coupled to a second cascode device of the level shifter, the second testability device operable to generate a second current in response to failure of the second cascode device.

6. The output buffer of claim 1, wherein the first testability device is selected from the group consisting of:
    a diode-PFET; and
    a diode-NFET.

7. The output buffer of claim 1, further comprising a third testability device coupled to the first output cascode, the third testability device operable to generate a third current in response to failure of the first output cascode.

8. The output buffer of claim 1, wherein the output buffer is coupled to a bias-generation circuit, the bias-generation circuit operable to supply a quasi-failsafe voltage to a device of the output buffer, the quasi-failsafe voltage approximately equal to the second voltage when the second power supply is supplying the second voltage to the bias-generation circuit and equal to a portion of the first voltage when the second power supply is not supplying the second voltage to the bias-generation circuit, the device of the output buffer selected from the group consisting of:
    the first output cascode;
    the second output cascode;
    the first testability device; and
    the first cascode device of the level shifter.

9. An output buffer coupling a data input and an enable input to an output, the output buffer operable to receive a first voltage from a first power supply and a second voltage from a second power supply, the output buffer comprising:
    a first output driver having a gate oxide;
    a first output cascode coupled to the first output driver and to the output, the first output cascode having a gate maintained at a first substantially constant voltage, the first output cascode operable to protect the gate oxide of the first output driver from voltage changes on the output;

a second output driver having a gate oxide;

a second output cascode coupled to the second output driver and to the output, the second output cascode having a gate maintained at a second substantially constant voltage, the second output cascode operable to protect the gate oxide of the second output driver from voltage changes on the output;

a level shifter coupled to the data input, to the enable input, and to the first output driver, the level shifter comprising a plurality of cascode devices and operable to provide a voltage to switch the first output driver according to the values of the data input and the enable input; and a plurality of testability devices, each testability device coupled to a corresponding cascode device of the level shifter, each testability device operable to generate a current in response to failure of the corresponding cascode device.

10. The output buffer of claim 9, wherein each of the testability devices is selected from the group consisting of:

a diode-PFET; and a diode-NFET.

11. The output buffer of claim 9, wherein the first substantially constant voltage and the second substantially constant voltage are both approximately equal to the second voltage when the second power supply is supplying the second voltage to the output buffer.

12. The output buffer of claim 9, wherein at least some of the testability devices are coupled to the first power supply, the current for any one of these testability devices being detectable as a change in current on the first power supply.

13. The output buffer of claim 9, wherein at least one of the testability devices is coupled to the second power supply, the current for the testability device being detectable as a change in current on the second power supply, the testability device further operable to turn the first output driver off in response to interruption in the second voltage from the second power supply to place the output buffer in a high-impedance state.

14. An output buffer coupling a data input and an enable input to an output, the output buffer operable to receive a first voltage from a first power supply and a second voltage from a second power supply, the output buffer comprising:

a first output driver coupled to the output and having a gate oxide;

a first output cascode coupled to the first output driver and to the output, the first output cascode operable to protect the gate oxide of the first output driver from voltage changes on the output;

a first testability device coupled to the first output cascode, the first testability device operable to generate a first current in response to failure of the first cascode device;

a second output driver coupled to the output and having a gate oxide;

a second output cascode coupled to the second output driver and to the output, the second output cascode operable to protect the gate oxide of the second output driver from voltage changes on the output;

a second testability device coupled to the second output cascode, the second testability device operable to generate a second current in response to failure of the second cascode device;

a level shifter coupled to the data input, to the enable input, and to the first output driver, the level shifter having a cascode device and operable to switch the first output driver according to the values of the data input and the enable input; and a third testability device coupled to the cascode device of the level shifter, the third testability device operable to generate a third current in response to failure of the cascode device.

15. The output buffer of claim 14, wherein the first output cascode and the second output cascode each comprise gates maintained at a substantially constant voltage that is approximately equal to the second voltage when the second power supply is supplying the second voltage to the output buffer.

16. The output buffer of claim 14, wherein the first current and the second current are each detectable as a change in current on the output.

17. The output buffer of claim 14, wherein the third testability device is coupled to the second power supply, the third current being detectable as a change in current on the second power supply, the third testability device further operable to turn the first output driver off in response to an interruption in the second voltage from the second power supply to place the output buffer in a high-impedance state.

18. The output buffer of claim 14, wherein the first, second, and third testability devices are each selected from the group consisting of:

a diode-PFET; and a diode-NFET.

19. The output buffer of claim 14, wherein the second voltage is approximately equal to one half of the first voltage.

20. The output buffer of claim 14, wherein the output buffer is coupled to a bias-generation circuit operable to supply a quasi-failsafe voltage to a device of the output buffer, the quasi-failsafe voltage being approximately equal to the second voltage when the second power supply is supplying the second voltage to the bias-generation circuit and equal to a portion of the first voltage when the second power supply is not supplying the second voltage to the bias-generation circuit, the device of the output buffer selected from the group consisting of:

the first output cascode;

the first testability device;

the second output cascode;

the second testability device;

the third testability device; and the first cascode device of the level shifter.

* * * * *